(12) United States Patent
Nishi et al.

(10) Patent No.: US 9,279,176 B2
(45) Date of Patent: Mar. 8, 2016

(54) LEAD WIRE FOR SOLAR CELL, MANUFACTURING METHOD AND STORAGE METHOD THEREOF, AND SOLAR CELL

(75) Inventors: Hajime Nishi, Hitachi (JP); Yuju Endo, Hitachi (JP); Ken Takahashi, Mito (JP); Hiromitsu Kuroda, Hitachi (JP); Hiroyuki Akutsu, Hitachi (JP); Katsunori Sawahata, Hitachi (JP); Hiroshi Bando, Hitachi (JP); Iku Higashidani, Hitachi (JP); Hiroshi Okikawa, Hitachi (JP)

(73) Assignee: Hitachi Metals, Ltd., Toyko (JP)

( * ) Notice: Subject to any disclaimer, the term of this patent is extended or adjusted under 35 U.S.C. 154(b) by 45 days.

(21) Appl. No.: 12/998,727

(22) PCT Filed: Nov. 20, 2009

(86) PCT No.: PCT/JP2009/069726
§ 371 (c)(1),
(2), (4) Date: May 25, 2011

(87) PCT Pub. No.: WO2010/061795
PCT Pub. Date: Jun. 3, 2010

(65) Prior Publication Data
US 2011/0220196 A1 Sep. 15, 2011

(30) Foreign Application Priority Data

Nov. 27, 2008 (JP) ................. 2008-302501
Oct. 7, 2009 (JP) ................. 2009-233758

(51) Int. Cl.
*H01B 5/00* (2006.01)
*C23C 2/08* (2006.01)
(Continued)

(52) U.S. Cl.
CPC ... *C23C 2/08* (2013.01); *C23C 2/02* (2013.01); *C23C 6/00* (2013.01); *C23C 26/02* (2013.01);
(Continued)

(58) Field of Classification Search
CPC .............. C23C 2/02; C23C 2/08; C23C 6/00; C23C 26/02; C23C 28/02; H01L 31/0508; H01L 31/0512
USPC ...................... 174/126.2, 261, 260, 262, 263; 136/244, 256
See application file for complete search history.

(56) References Cited

U.S. PATENT DOCUMENTS 5,341,980 A   8/1994   Nishikawa et al.
5,516,031 A   5/1996   Nishikawa et al.
(Continued)

FOREIGN PATENT DOCUMENTS

CN   1747183 A   3/2006
CN   1957479 A   5/2007
(Continued)

OTHER PUBLICATIONS

Chinese Office Action dated Oct. 10, 2012, with English translation.
(Continued)

*Primary Examiner* — Yuriy Semenenko
(74) *Attorney, Agent, or Firm* — McGinn IP Law Group, PLLC

(57) ABSTRACT

A solar cell lead wire includes a molten solder plated layer on a strip-shaped conductive material formed rectangular in a cross section thereof so as to be bonded by soldering to an electrode of a solar cell, using a flux. A thickness of an oxide film on a surface of the molten solder plated layer, which is a sum of a thickness of an SnO layer and a thickness of an $SnO_2$ layer on the surface of the molten solder plated layer, is not more than 7 nm.

1 Claim, 5 Drawing Sheets

(51) Int. Cl.
*C23C 2/02* (2006.01)
*C23C 6/00* (2006.01)
*C23C 26/02* (2006.01)
*H01L 31/05* (2014.01)
*C23C 28/00* (2006.01)

(52) U.S. Cl.
CPC ............ *C23C 28/321* (2013.01); *C23C 28/322* (2013.01); *C23C 28/345* (2013.01); *H01L 31/0508* (2013.01); *H01L 31/0512* (2013.01); *Y02E 10/50* (2013.01)

(56) References Cited

U.S. PATENT DOCUMENTS

| | | | |
|---|---|---|---|
| 5,816,473 | A | 10/1998 | Nishikawa et al. |
| 5,865,365 | A | 2/1999 | Nishikawa et al. |
| 5,878,943 | A | 3/1999 | Nishikawa et al. |
| 6,227,436 | B1 * | 5/2001 | Nishikawa et al. ...... 228/180.22 |
| 6,248,258 | B1 * | 6/2001 | Tomita et al. ............ 252/188.28 |
| 6,471,115 | B1 | 10/2002 | Ijuin et al. |
| 7,148,426 | B2 * | 12/2006 | Aoyama et al. ............... 174/260 |
| 7,754,973 | B2 | 7/2010 | Shiomi et al. |
| 8,299,350 | B2 * | 10/2012 | Saita et al. .................... 136/244 |
| 8,653,380 | B2 * | 2/2014 | Nishi et al. .................... 174/260 |
| 2003/0024733 | A1 | 2/2003 | Aoyama et al. |
| 2007/0017570 | A1 | 1/2007 | Endo et al. |
| 2007/0062574 | A1 | 3/2007 | Shiomi et al. |
| 2008/0076307 | A1 * | 3/2008 | Nishi et al. .................... 439/886 |
| 2008/0169020 | A1 * | 7/2008 | Shiomi et al. ................. 136/252 |
| 2009/0283573 | A1 | 11/2009 | Shiomi et al. |
| 2011/0220196 | A1 | 9/2011 | Nishi et al. |

FOREIGN PATENT DOCUMENTS

| | | | |
|---|---|---|---|
| EP | 0 884 936 | A1 | 12/1998 |
| EP | 1 298 229 | A1 | 4/2003 |
| EP | 1 626 443 | A1 | 2/2006 |
| JP | S54-109048 | A | 8/1979 |
| JP | S61-107612 | A | 5/1986 |
| JP | 9-232742 | A | 9/1997 |
| JP | H10-088323 | A | 4/1998 |
| JP | H11-66965 | A | 3/1999 |
| JP | 2000-000685 | A | 1/2000 |
| JP | 2000-328274 | A | 11/2000 |
| JP | 2002-042548 | A | 2/2002 |
| JP | 2002-263880 | A | 9/2002 |
| JP | 2003-311873 | A | 11/2003 |
| JP | 2004-209494 | | 7/2004 |
| JP | 2008-98315 | A | 4/2008 |
| JP | 2008-098607 | A | 4/2008 |
| WO | WO 97/32457 | A1 | 9/1997 |
| WO | WO 2004/105141 | A1 | 12/2004 |
| WO | WO 2005/114751 | A1 | 12/2005 |
| WO | WO 2010/061795 | A1 | 6/2010 |

OTHER PUBLICATIONS

"Development of Pb-Free Solder with Higher Reliability for Inter Connection" (Hitachi Densen, No. 26 (Jan. 2007), pp. 19-22) (with English translation).

Notice including Information Offer Form on Prior Arts submitted by a nameless third party to the Japanese Patent Office dated Jun. 19, 2012, with English Translation.

Information Offer Form on Prior Art dated Mar. 25, 2014 with an English Translation.

Japanese Office Action dated Mar. 24, 2015, with an English translation.

Japanese Office Action dated Jan. 20, 2015 with a partial English translation.

Japanese Office Action dated Aug. 26, 2014 with English Abstract thereof.

Japanese Office Action dated Jun. 30, 2015, with an English translation.

Japanese Office Action dated Nov. 4, 2015 with a partial English translation.

* cited by examiner

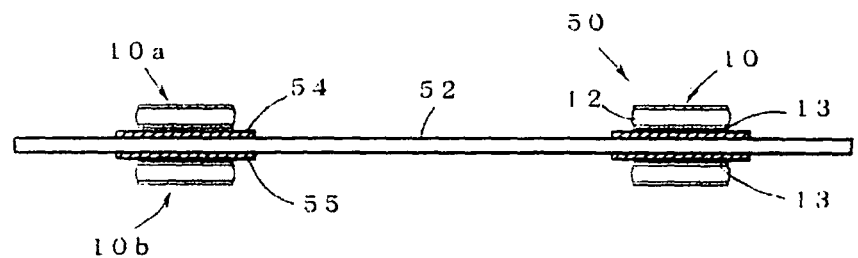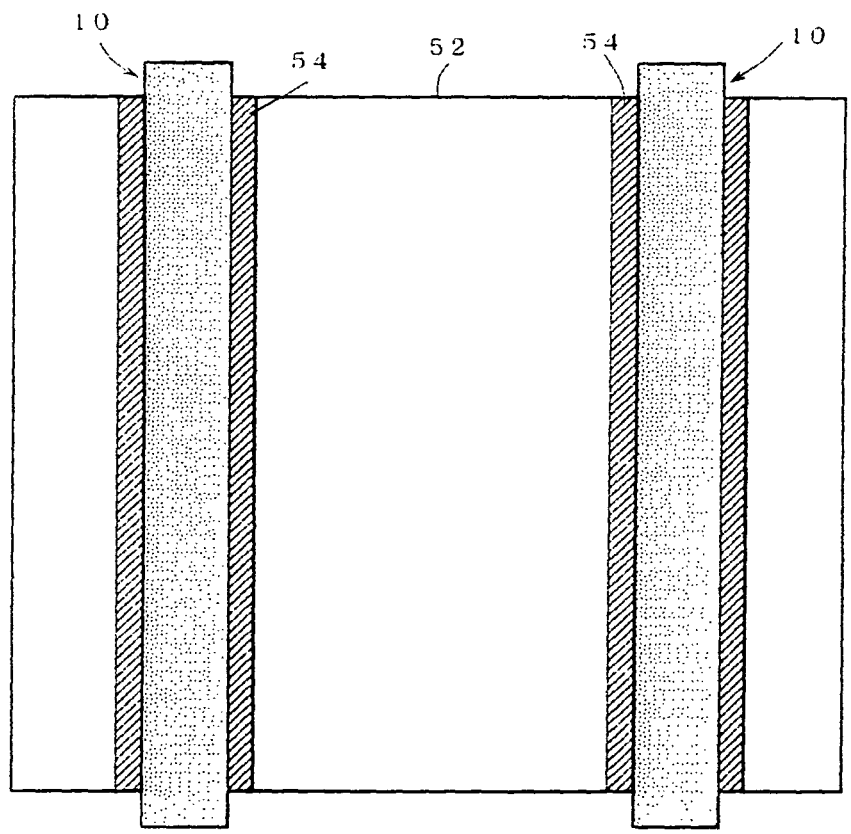

LEAD WIRE FOR SOLAR CELL, MANUFACTURING METHOD AND STORAGE METHOD THEREOF, AND SOLAR CELL

TECHNICAL FIELD

The present invention relates to a solar cell lead wire and, in particular, a solar cell lead wire having an excellent bondability to a cell, a manufacturing method and a storage method of the solar cell lead wire, and a solar cell. This application is based on Japanese Patent Application No. 2008-302501 filed on Nov. 27, 2008, and Japanese Patent Application No. 2009-233758 filed on Oct. 7, 2009, the entire contents of which are herein incorporated by reference.

BACKGROUND ART

In a solar cell, a polycrystalline or single crystal Si cell is used as a semiconductor substrate.

A configuration of a conventional solar cell will be described based on a solar cell 50 of the present invention shown in FIGS. 4A and 4B. The solar cell 50 is manufactured by bonding solar cell lead wires 10a and 10b to a predetermined region of a semiconductor substrate 52, i.e., to a front surface electrode 54 provided on a front surface of the semiconductor substrate 52 and to a back surface electrode 55 provided on a back surface thereof, using a solder. Electricity generated in the semiconductor substrate 52 is transmitted to the outside through the solar cell lead wire.

A configuration of a conventional solar cell lead wire will be described based on a solar cell lead wire 10 of the present invention shown in FIGS. 1A and 1B. A solar cell lead wire 10 is provided with a strip-shaped conductive material 12 and a molten solder plated layer 13 formed on upper and lower surfaces of the strip-shaped conductive material 12. The strip-shaped conductive material 12 is, e.g., a circular cross-section conductor roll-processed into a strip shape, which is called a flat conductor or a flat wire.

The molten solder plated layer 13 is formed by supplying a molten solder on the upper and lower surfaces of the strip-shaped conductive material 12 using a hot-dip coating method.

The hot-dip coating method is a method in which the upper and lower surfaces of the strip-shaped conductive material 12 are cleaned by acid pickling, etc., and a solder is laminated on the upper and lower surfaces 12a and 12b of the strip-shaped conductive material 12 by passing the strip-shaped conductive material 12 through a molten solder bath. As shown in FIG. 1A, the molten solder plated layer 13 is formed in a shape bulging from a side portion in a width direction to a center portion, so-called a mountain-like shape, by an effect of surface tension at the time of solidification of the molten solder adhered on the upper and lower surfaces 12a and 12b of the strip-shaped conductive material 12.

The solar cell lead wire 10 is cut to a predetermined length, is sucked up by air suction and moved onto a front surface electrode (grid) 54 of the semiconductor substrate 52, and is soldered to the front surface electrode 54 of the semiconductor substrate 52. An electrode band (finger) (not shown) electrically conducting with the front surface electrode 54 is preliminarily formed on the front surface electrode 54. The molten solder plated layer 13 of the solar cell lead wire 10a is brought in contact with the front surface electrode 54, and soldering is carried out in this state. The soldering of the solar cell lead wire 10b to the back surface electrode 55 of the semiconductor substrate 52 is carried out in the same way.

Conventionally, the front surface electrode 54 is impregnated with solder of the same nature as the molten solder plated layer 13 of the solar cell lead wire 10 in order to impart good solder bondability (or soldering strength) between the front surface electrode 54 of the semiconductor substrate 52 and the solar cell lead wire 10. However, the semiconductor substrate 52 has become thinner in recent years and a problem of damage to the semiconductor substrate 52 at the time of impregnating the front surface electrode 54 with the solder has emerged. Therefore, omission of solder impregnation process performed on the front surface electrode 54 has been promoted in order to avoid damage to the semiconductor substrate 52.

Due to the omission of solder impregnation process which is performed to impart good solder bondability between the front surface electrode 54 of the semiconductor substrate 52 and the solar cell lead wire 10, the case in which sufficient bondability is not obtain is often seen even in the case of using a solar cell lead wire which conventionally has no problem of bondability. The semiconductor substrate 52 is bonded to the solar cell lead wire 10 by a formation of an intermetallic compound (e.g., $Ag_3Sn$) between an electrode material of the front surface electrode 54 (e.g., Ag) and a bonding material of the molten solder plated layer 13 (e.g., Sn). This bonding requires that a metal atom of the solder (Sn) directly collides with a metal atom of the electrode (Ag) after an oxide film is removed from a surface of the molten solder plated layer 13 and from a surface of the front surface electrode 54 due to flux effect, and that diffusion of an Sn atom present in the solder into a lattice of another atom (Ag) is enhanced by heating. That is, when the oxide film on the surface of the molten solder plated layer 13 is very thick, the removal of the oxide film by flux is not sufficient and a soldering defect occurs.

Since the bonding between the semiconductor substrate 52 and the solar cell lead wire 10 becomes insufficient when the soldering failure occurs between the front surface electrode 54 and the solar cell lead wire 10, a module output decreases due to mechanical removal or conductivity failure.

The patent document 1 suggests a method in which 0.002 to 0.015 mass % of P is added to solder in order to suppress generation of an oxide film on the solder surface during manufacture or in use.

In the solar cell lead wire of the patent document 1, the oxide film has a thickness of about 1 to 2 μm without discoloration up to a heating temperature of 300° C., and the oxide film has a thickness of about 5 μm with slight discoloration only after reaching 350° C. On the other hand, it is described that the oxide film already has a thickness of more than 6 μm with significant discoloration at 250° C. in the prior art. Further, the patent document 1 describes that both the invention and the prior art have an oxide film with a thickness of about 1 μm in the case without heating.

PRIOR ART DOCUMENT

Patent Document

[Patent document 1] Japanese patent Laid-Open No. 2002-263880

SUMMARY OF THE INVENTION

Problems to be Solved by the Invention

As described above, the thickness of the oxide film on the surface of the molten solder plated layer 13 should be thinned in order to firmly bond the solar cell lead wire to the semiconductor substrate. However, according to the patent document 1, the oxide film of the invention already has a thickness of about 1 μm (1000 nm) even in a state before heating. Therefore, it is not sufficient to obtain strong bondability between the semiconductor substrate, for which the solder impregnation process on the front surface electrode is omitted, and the solar cell lead wire.

Therefore, it is an object of the present invention to solve the above-mentioned problem and to provide a solar cell lead wire having excellent bondability with a cell, a manufacturing method and a storage method thereof, and a solar cell.

Means for Solving the Problems

In order to achieve the above-mentioned object, a feature of the present invention is a solar cell lead wire comprising a molten solder plated layer on a strip-shaped conductive material formed rectangular in a cross section thereof so as to be bonded to a solar cell, wherein a thickness of an oxide film on a surface of the molten solder plated layer is not more than 7 nm.

In the above-mentioned solar cell lead wire, the strip-shaped conductive material may be a flat wire having a volume resistivity of not more than 50 μΩ·mm.

In the above-mentioned solar cell lead wire, the strip-shaped conductive material may comprise any one of Cu, Al, Ag and Au.

In the above-mentioned solar cell lead wire, the strip-shaped conductive material may comprise any one of tough pitch Cu, low-oxygen Cu, oxygen-free Cu, phosphorus deoxidized Cu and high purity Cu having a purity of not less than 99.9999%.

In the above-mentioned solar cell lead wire, the molten solder plated layer may comprise a Sn-based solder, or, a Sn-based solder alloy using Sn as a first component and containing not less than 0.1 mass % of at least one element selected from the group consisting of Pb, In, Bi, Sb, Ag, Zn, Ni and Cu as a second component.

Another feature of the present invention is a method of manufacturing a solar cell lead wire comprising forming a strip-shaped conductive material by roll-processing or slit-processing a wire, heat-treating the strip-shaped conductive material in a continuous electrical heating or continuous heating furnace or a batch heating equipment, and when subsequently performing solder plating on the strip-shaped conductive material by supplying a molten solder, adjusting a plating temperature thereof to not more than a liquidus-line temperature of the solder plus 120° C.

In the above-mentioned method of manufacturing a solar cell lead wire, solder plating may be performed on the strip-shaped conductive material by supplying a molten solder at a plating operating atmospheric temperature of not more than 30° C. and at a relative humidity of not more than 65% of the plating operating atmosphere.

Still another feature of the present invention is a storage method of a solar cell lead wire, comprising storing the above-mentioned solar cell lead wire after packing with a packing material having an oxygen permeability of not more than 1 mL/m²·day·MPa and a water vapor permeability of not more than 0.1 g/m²·day.

In the above-mentioned storage method of a solar cell lead wire, the above-mentioned solar cell lead wire may be stored at a temperature of not more than 30° C. and at a relative humidity of not more than 65% in an unpacked state or in a state that the packing is opened.

Still another feature of the present invention is a solar cell comprising the above-mentioned solar cell lead wire that is soldered to front and back surface electrodes of a semiconductor substrate by using a solder in a molten solder plated layer thereof.

Effect of the Invention

According to the present invention, it is possible to obtain a solar cell lead wire having excellent bondability with a cell.

BRIEF DESCRIPTION OF THE DRAWINGS

FIG. 4A is a transverse sectional view showing a solar cell in which the solar cell lead wire shown in FIG. 1A is used.

FIG. 4B is a top view showing the solar cell shown in FIG. 4A in which the solar cell lead wire is used.

MODE FOR CARRYING OUT THE INVENTION

A preferred embodiment of the present invention will be explained in detail as below in conjunction with appended drawings.

As shown in FIG. 1, a solar cell lead wire 10 of the present invention is formed by supplying a molten solder on upper and lower surfaces of the strip-shaped conductive material 12 and being plated at an outlet port of a solder bath.

A wire (a wire rod having a circular cross section) is roll-processed and is heat-treated in a continuous electrical heating furnace or a batch-type heating equipment, thereby forming the strip-shaped conductive material 12.

Figure 1A:
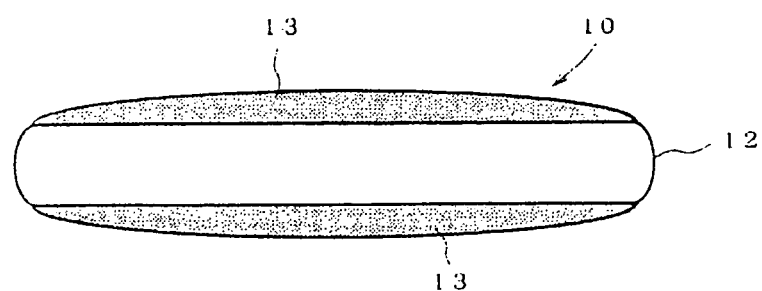
FIG. 1A is a transverse sectional view showing a solar cell lead wire in a preferred embodiment of the present invention.
Figure 1B:
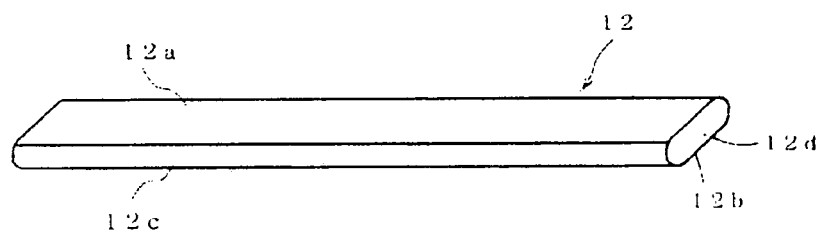
FIG. 1B is a perspective view showing a strip-shaped conductive material which is one of the raw materials for the solar cell lead wire of FIG. 1A.

FIG. 1B shows a perspective view of the strip-shaped conductive material 12, in which an upper surface 12a and a lower surface 12b are formed to be flat surfaces, a side surface 12c is formed to be convexly bulged shape and an edge surface 12d is formed by cutting to an appropriate length.

Figure 3:
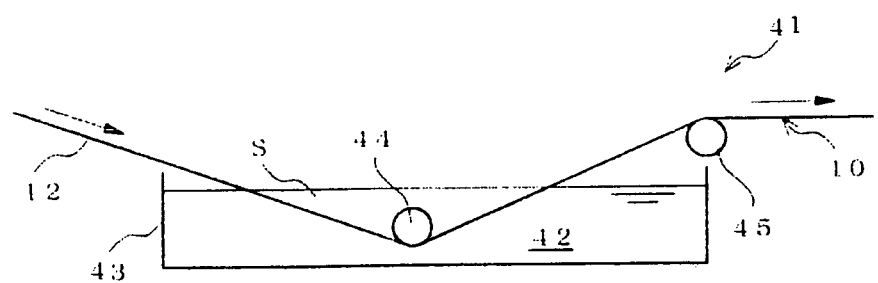
FIG. 3 is a schematic view showing a hot-dip plating equipment for forming a molten solder plated layer in the present embodiment.

FIG. 3 shows a hot-dip solder plating equipment.

A hot-dip plating equipment 41 is provided with a solder bath 43 for storing molten solder (plating molten solder) 42 formed of molten solder S, an upstream guide roller 44 provided in the molten solder 42 to guide the strip-shaped conductive material 12 fed from a feeder into the molten solder 42, and a downstream guide roller 45 provided downstream of the solder bath 43 to guide the solar cell lead wire 10, which is made by passing the molten solder 42 and the upstream guide roller 44, to a winder.

Here, the temperature of the molten solder 43 needs to be set to higher than the melting point of the solder used, however, Sn in the solder is easily diffused in the molten state and is bonded to oxygen in the air, and thus, oxide film generation is remarkably enhanced. In addition, an operating atmospheric temperature and a level of humidity also contribute to promote oxide film generation. Therefore, it is desirable that the temperature of the molten solder be below the liquidus-line temperature of the solder used plus 120° C. (the lower limit is the liquidus-line temperature plus 50° C.), the plating operating atmospheric temperature be 30° C. or less (the lower limit is 10° C.), and relative humidity in the plating operating atmosphere be 65% or less (the lower limit is 10%).

By the above-mentioned manufacturing method, it is possible to manufacture a solar cell lead wire in which an oxide film on a surface of solder plated layer has a thickness of 3.0 nm or less (the lower limit is 0.5 nm).

In addition, even when the manufactured solar cell lead wire is packed with a packing material having an oxygen permeability of 1 mL/m$^2$·day·MPa or less and a water vapor permeability of 0.1 g/m$^2$·day or less, or is unpacked, or is in a state that the packing is opened, it is possible to suppress thickness growth of the oxide film to 7 nm or less (the lower limit is 0.5 nm) under the storage conditions of a temperature of 30° C. or less (the lower limit is 10° C.) and 65% or less relative humidity (the lower limit is 10%).

As described above, the solar cell lead wire 10 of the present invention has an oxide film of 7 nm or less in thickness on the surface of the molten solder plated layer 13 so that the bonding to the front and back surface electrodes of the semiconductor substrate is strong. This facilitates removal of the oxide film at the time of solder bonding and allows the solar cell lead wire 10 to be firmly soldered to the front and back surface electrodes. That is, it is possible to prevent a decrease in module output caused by mechanical removal or conductivity failure.

For the strip-shaped conductive material 12, for example, a flat wire having a volume resistivity of 50 μΩ·mm or less is used.

By roll-processing the flat wire, it is possible to obtain the strip-shaped conductive material 12 having a horizontal cross-sectional shape as shown in FIG. 1B, or the strip-shaped conductive material 12 can be obtained by slit-processing.

The strip-shaped conductive material 12 is formed of any one of Cu, Al, Ag and Au, or any one of tough pitch Cu, low-oxygen Cu, oxygen-free Cu, phosphorus deoxidized Cu and high purity Cu having a purity of 99.9999% or more.

As the molten solder plated layer, a Sn-based solder (a Sn-based solder alloy) is used. In the Sn-based solder, Sn is used as a first component which has the heaviest component weight, and 0.1 mass % or more of at least one element selected from the group consisting of Pb, In, Bi, Sb, Ag, Zn, Ni and Cu is contained as a second component.

The effect of the present embodiment will be explained below.

For soldering the solar cell lead wire 10 shown in FIG. 1A to the front surface electrode 54 and the back surface electrode 55 of the semiconductor substrate 52 shown in FIG. 4, a heating temperature of the solar cell lead wire 10 or the semiconductor substrate 52 is controlled to a temperature near the melting point of the solder in the molten solder plated layer 13. The reason is that a thermal expansion coefficient of the strip-shaped conductive material 12 of the solar cell lead wire 10 (e.g., copper) is largely different from that of the semiconductor substrate 52 (Si). Heat stress which causes generation of crack on the semiconductor substrate 52 is generated due to the difference in the thermal expansion coefficient. Low temperature bonding should be performed in order to decrease the heat stress. Thus, the heating temperature of the solar cell lead wire 10 or the semiconductor substrate 52 is controlled to a temperature near the melting point of the solder in the molten solder plated layer 13.

In the above-mentioned heating method during the bonding, the semiconductor substrate 52 is placed on a hot plate, and heat from the hot plate is used together with heat from upside of the solar cell lead wire 10 placed on the semiconductor substrate 52.

In order to increase the contact area of the front surface electrode 54 and the back surface electrode 55 of the semiconductor substrate 52 with the molten solder plated layer 13 for obtaining sufficient heat conduction from the semiconductor substrate 52 to the molten solder plated layer 13, the solar cell lead wire 10 including the molten solder plated layer 13 should be formed in a rectangular shape.

However, since the oxide film on the surface of the molten solder plated layer is thick in the conventional solar cell lead wire, oxide film removal by flux used at the time of solder bonding to the front surface electrode 54 is insufficient, which causes a soldering defect, and as a result, problems arise such that mechanical removal occurs or that sufficient output is not obtained due to conductivity failure.

Since the oxide film on the surface of the molten solder plated layer 13 to be the upper and lower surfaces of the solar cell lead wire 10 in the present embodiment has a thickness of 7 nm or less, the oxide film removal by flux is facilitated and soldering reliability is satisfactory, hence, the above-mentioned conventional problem can be solved.

Here, the oxide film thickness can be defined by time of decreasing to half of the oxidation peak value in a depth profile obtained by Auger analysis.

Next, Table 1 shows physicality of the material of the strip-shaped conductive material used in the present invention.

TABLE 1

| Material | Cu | Ag | Au | Al |
|---|---|---|---|---|
| Thermal expansion coefficient (×10$^{-6}$/° C.) | 17.0 | 19.0 | 29.1 | 23.5 |
| 0.2% proof stress (MPa) | 40 | 55 | 30 | 20 |
| Volume resistivity(μΩ · mm) | 16.9 | 16.3 | 22.0 | 26.7 |

The strip-shaped conductive material 12 is preferably a material having relatively small volume resistivity, which is 50 μΩ·mm or less. Such a material includes Cu, Al, Ag and Au, etc., as shown in Table 1.

The volume resistivity of the Ag is the lowest among Cu, Al, Ag and Au. Therefore, when Ag is used as the strip-shaped conductive material 12, it is possible to maximize power generation efficiency of a solar cell using the solar cell lead wire 10. When Cu is used as the strip-shaped conductive material, it is possible to reduce cost of the solar cell lead wire. When Al is used as the strip-shaped conductive material, it is possible to reduce weight of the solar cell lead wire 10.

When Cu is used as the strip-shaped conductive material, any one of tough pitch Cu, low-oxygen Cu, oxygen-free Cu, phosphorus deoxidized Cu and high purity Cu having a purity of 99.9999% or more may be used for the Cu. In order to minimize the 0.2% proof stress of the strip-shaped conductive material, it is advantageous to use highly-pure Cu. Therefore, when the high purity Cu having a purity of 99.9999% or more is used, it is possible to decrease the 0.2% proof stress of the strip-shaped conductive material. When the tough pitch Cu or the phosphorus deoxidized Cu is used as the strip-shaped conductive material 12, it is possible to reduce cost of the solar cell lead wire.

A solder used for the molten solder plated layer includes a Sn-based solder, or a Sn-based solder alloy in which Sn is used as a first component and 0.1 mass % or more of at least one element selected from the group consisting of Pb, In, Bi, Sb, Ag, Zn, Ni and Cu is contained as a second component.

These solders may contain 1000 ppm or less of trace element as a third component.

Next, a method of manufacturing the solar cell lead wire of the present invention will be explained.

Firstly, a strip-shaped conductive material is formed by roll-processing a wire rod having a circular cross section (shot shown) which is a row material, or by slit-processing a plate. The strip-shaped conductive material is heat-treated in a continuous electrical heating furnace, a continuous heating furnace or a batch-type heating equipment. Then, a molten solder plated layer is formed by supplying a molten solder using a plating line such as shown in FIG. 3.

Here, the temperature of the molten solder needs to be set to higher than the melting point of the solder used, however, Sn in the solder is easily diffused in the molten state and is bonded to oxygen in the air, and thus, oxide film generation is remarkably enhanced. In addition, a manufacturing atmospheric temperature and a level of humidity also contribute to promote oxide film generation. Therefore, it is desirable that the temperature of the molten solder be below the liquidus-line temperature of the solder used plus 120° C., the plating operating atmospheric temperature be 30° C. or less and relative humidity in the plating operating atmosphere be 65% or less. In this regard, the temperature of the molten solder indicates a value measured by a contact-type thermometer at a position within 5 cm from the inlet or outlet port to let the strip-shaped conductive material into or out from the molten solder, and the plating operating atmospheric temperature and the relative humidity indicate values measured at 5 m from a plating line.

By the above-mentioned manufacturing method, it is possible to manufacture a solar cell lead wire in which an oxide film on a surface of solder plated layer has a thickness of 3.0 nm or less. The oxide film thickness shown here is an average value of the data obtained by performing Auger analysis at 5 points on the solder-plated surface (the upper or lower surface). Meanwhile, by SERA (Sequential Electrochemical Reduction Analysis), it is possible to confirm that the component of the oxide film shown here is an oxide of tin (Sn) (SnO: tin oxide (II), $SnO_2$: tin oxide (IV)). The oxide film thickness obtained by the SERA analysis, which is SnO film thickness plus $SnO_2$ film thickness, is substantially equivalent to the oxide film thickness obtained by the Auger analysis.

In addition, even when the manufactured solar cell lead wire is packed with a packing material having an oxygen permeability of 1 mL/$m^2$·day·MPa or less and a water vapor permeability of 0.1 g/$m^2$·day or less, or is unpacked, or is in a state that the packing is opened, it is possible to suppress thickness growth of the oxide film to 7 nm or less under the storage conditions of a temperature of 30° C. or less and 65% or less relative humidity.

As a processing method for processing a raw material into a strip-shaped conductive material, both a rolling process and a slit processing are applicable. The rolling process is a method to form a round wire into a rectangle by rolling. When the strip-shaped conductive material is formed by the rolling process, it is possible to form a long strip-shaped conductive material having a uniform width in a longitudinal direction. Materials having various widths can be dealt by the slit processing. In other words, even when a width of a raw conductive material is not uniform in a longitudinal direction or even when various raw conductive materials having different widths are used, it is possible to form a long strip-shaped conductive material having a uniform width in a longitudinal direction by the slit processing.

It is possible to improve softening characteristics of the strip-shaped conductive material by heat treating the strip-shaped conductive material. Improving the softening characteristics of the strip-shaped conductive material is advantageous to reduce the 0.2% proof stress. A heat treatment method includes, e.g., continuous electrical heating, continuous heating and batch-type heating. The continuous electrical heating and the continuous heating are preferable for continuously heat treating over a long length. When stable heat treatment is required, the batch-type heating is preferable. From the point of view of preventing oxidation, it is preferable to use a furnace with an inert gas atmosphere such as nitrogen, etc., or a hydrogen reduction atmosphere.

The furnace with an inert gas atmosphere or with a hydrogen reduction atmosphere is provided by the continuous electrical heating furnace, the continuous heating furnace or the batch-type heating equipment.

Figure 2:
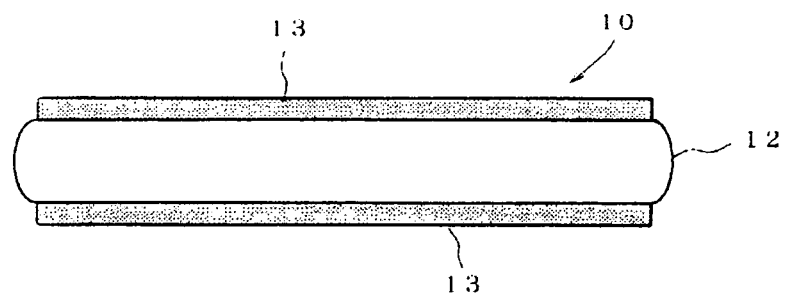
FIG. 2 is a transverse sectional view showing a solar cell lead wire in another preferred embodiment of the present invention.

Meanwhile, in the solar cell lead wire 10 of the present invention, upper and lower molten solder plated layers 13 are formed flat as shown in FIG. 2 by supplying the molten solder on the upper and lower surfaces of the strip-shaped conductive material 12 and sandwiching the plated strip-shaped conductive material 12 at an outlet port of a solder bath to adjust the plating thickness. Here, "flat" indicates that asperity on the plated surface has a height of 3 μm or less. In addition, the oxide film formed on the surface of the molten solder plated layer 13 is formed in the same manner as explained with reference to FIGS. 1A and 1B.

A wire (a wire rod having a circular cross section) is roll-processed and is heat-treated in a continuous electrical heating furnace, a continuous heating furnace or a batch-type heating equipment, thereby forming the strip-shaped conductive material 12.

This configuration suppress an amount of solder to be supplied when the conductor width of the strip-shaped conductive material 12 shown in FIG. 2 is equivalent to an electrode width, i.e., the shape in FIG. 2 prevents solder used for bonding the strip-shaped conductive material to the semiconductor substrate from being excessively supplied to a bonding portion of the front or back surface electrode and from flowing out to a portion other than the electrodes, thereby preventing a cell light-receiving surface from diminishing. As a result, it is possible to obtain the solar cell lead wire 10 excellent in shadow loss suppression.

In addition, it is possible to place the strip-shaped conductive material on the front and back surface electrodes in an orderly manner, which allows strong solder-bondability. Then, since the plated layer is flat, adhesion to an air suction jig is high and it is less likely to fall off when being moved. Furthermore, the flat plated layer facilitates to obtain a stable laminated state at the time of winding around a bobbin, and deformation of the winding is less likely to occur. Therefore, the problem, in which a lead wire is tangled due to the deformation of the winding and is not pulled out, is solved.

Next, a solar cell of the present invention will be explained in detail.

As shown in FIGS. 4A and 4B, in a solar cell 50 of the present invention, the solar cell lead wires 10 which have been described above are soldered to the front surface electrode 54 and the back surface electrode 55 of the semiconductor substrate 52 by the solder in the molten solder plated layer 13 in which the oxide film on the plated surface has a thickness of 7 nm or less. For the solar cell 50, solder impregnation of the front surface electrode 54 and the back surface electrode 55 of the semiconductor substrate 52 is not necessary since the solar cell lead wire 10 having a solder plated layer in which an oxide film on the plated surface has a thickness of 7 nm or less is used. Therefore, it is possible to avoid damage caused by performing the solder impregnation of an electrode of a thinned semiconductor substrate. In this regard, however, the solar cell lead wire 10 of the present invention is applicable to a semiconductor substrate of the type in which an electrode is impregnated with solder, and the application thereof is not limited to a semiconductor substrate of the type in which an electrode is not impregnated with solder.

In the present invention, the oxide film on the surface of the molten solder plated layer 13 as a bonded surface between the solar cell lead wire 10 and the front surface electrode 54 as well as the back surface electrode 55 is very thin such as 7 nm or less. Therefore, the oxide film is easily broken by flux effect at the time of solder bonding to the front surface electrode 54 and the back surface electrode 55 of the semiconductor substrate 52 and satisfactory solder wettability is obtained, which makes the solder bonding of the molten solder plated layer 13 to the front surface electrode 54 and the back surface electrode 55 strong. In other words, the joint with high bonding strength is obtained between the solar cell lead wire 10 and the semiconductor substrate 52.

In the solar cell 50 of the present invention, since the bonding strength between the solar cell lead wire 10 and the semiconductor substrate 52 is high, it is possible to improve a manufacturing yield and module output of the solar cell module.

Figure 5:
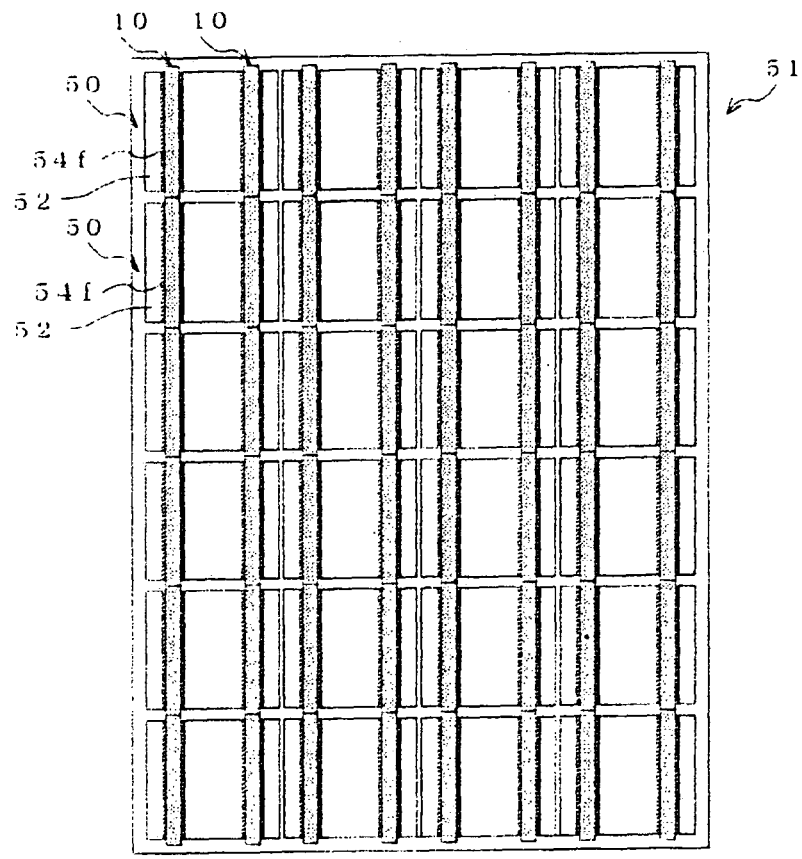
FIG. 5 is a top view showing an example of a solar cell module using the solar cell shown in FIG. 4.

Meanwhile, the solar cell 50 is used for a solar cell module 51 which is formed by, e.g., horizontally and vertically arraying and arranging plural solar cells 50 as shown in FIG. 5. In this case, for example, a solar cell lead wire 10 bonded to a front surface electrode 54f of one solar cell 50 is linearly solder-connected to a solar cell lead wire 10 bonded to a front surface electrode 54f of another solar cell 50, thereby electrically connecting between vertically adjacent cells.

The solar cell lead wire 10 bonded to the front surface electrode 54f of the one solar cell 50 may be solder-connected to a solar cell lead wire bonded to a back surface electrode of the other solar cell 50 at a different level to electrically connect between vertically adjacent cells.

EXAMPLES

Example 1

A Cu material as a raw conductive material was roll-processed, thereby forming a strip-shaped conductive material in a rectangular shape of 2.0 mm in width and 0.16 mm in thickness. The strip-shaped conductive material was heat-treated in a batch-type heating equipment, and further, Sn-3% Ag-0.5% Cu solder plating (liquidus-line temperature of 220° C.) was applied on the peripheral surface of the strip-shaped conductive material in the hot-dip plating equipment shown in FIG. 3 (at molten solder temperature of 340° C., workplace temperature of 30° C. and humidity in the workplace of 62 RH %), thereby forming a molten solder plated layer (a plating thickness is 20 μm at a middle portion) on upper and lower surfaces of the strip-shaped conductive material (a conductor is a heat-treated Cu). From the above, the solar cell lead wire of FIG. 1A was obtained. After that, oxide film thickness measurement (Auger analysis) and bonding strength measurement were immediately conducted.

Examples 2, 3, 4 and 5

A strip-shaped conductive material was formed in the same manner as the solar cell lead wire 10 of Example 1, was heat-treated in a batch-type heating equipment, and further, Sn-3% Ag-0.5% Cu solder plating (liquidus-line temperature of 220° C.) was applied on the peripheral surface of the strip-shaped conductive material in the hot-dip plating equipment shown in FIG. 3 (at molten solder temperature of 340° C., workplace temperature of 30° C. and humidity in the workplace of 65 RH %), thereby forming a molten solder plated layer (a plating thickness is 20 μm at a middle portion) on upper and lower surfaces of the strip-shaped conductive material (a conductor is a heat-treated Cu). Furthermore, in Example 2, the manufactured solar cell lead wire was not packed and was stored in a constant temperature and humidity bath for 3 months under the conditions of 30° C.×65 RH %, and then, the oxide film thickness measurement (Auger analysis) and the bonding strength measurement were conducted. In Examples 3 to 5, the manufactured solar cell lead wire was packed in a degassed Al-bag (12 μm of antistatic PET/9 μm of Al foil/15 μm of nylon/50 μm of antistatic LLDPE, oxygen permeability of 1 mL/m$^2$·day·MPa and a water vapor permeability of 0.1 g/m$^2$·day) and was stored in a constant temperature and humidity bath for 3 months under the conditions of 60° C.×95 RH % in Example 3, the conditions of 70° C.×95 RH % in Example 4 and the conditions of 80° C.×95 RH % in Example 5, and then, the oxide film thickness measurement (Auger analysis) and the bonding strength measurement were conducted.

Examples 6 and 7

A strip-shaped conductive material was formed in the same manner as the solar cell lead wire 10 of Example 1, was heat-treated in a batch-type heating equipment, and further, Sn-3% Ag-0.5% Cu solder plating (liquidus-line temperature of 220° C.) was applied on the peripheral surface of the strip-shaped conductive material in the hot-dip plating equipment shown in FIG. 3 (at molten solder temperature of 340° C., workplace temperature of 20° C. and humidity in the workplace of 50 RH % in Example 6, and at molten solder temperature of 340° C., workplace temperature of 30° C. and humidity in the workplace of 65 RH % in Example 7), thereby forming a molten solder plated layer (a plating thickness is 20 μm at a middle portion) on upper and lower surfaces of the strip-shaped conductive material (a conductor is a heat-treated Cu). Furthermore, in Example 6, after making the solar cell lead wire, the oxide film thickness measurement (Auger analysis) and the bonding strength measurement were immediately conducted. In Example 7, the manufactured solar cell lead wire was packed in a degassed Al-bag (12 μm of antistatic PET/9 μm of Al foil/15 μm of nylon/50 μm of antistatic LLDPE, oxygen permeability of 1 mL/m$^2$·day·MPa and a water vapor permeability of 0.1 g/m$^2$·day) and was stored in a constant temperature and humidity bath for 3 months under the conditions of 85° C.×95 RH %, and then, the oxide film thickness measurement (Auger analysis) and the bonding strength measurement were conducted.

Comparative Example 1

A strip-shaped conductive material was formed in the same manner as the solar cell lead wire 10 of Example 1, was heat-treated in a batch-type heating equipment, and further, Sn-3% Ag-0.5% Cu solder plating (liquidus-line temperature of 220° C.) was applied on the peripheral surface of the strip-shaped conductive material in the hot-dip plating equipment shown in FIG. 3 (at molten solder temperature of 350° C., workplace temperature of 35° C. and humidity in the workplace of 70 RH %), thereby forming a molten solder plated layer (a plating thickness is 20 μm at a middle portion) on upper and lower surfaces of the strip-shaped conductive material (a conductor is a heat-treated Cu). After that, the oxide film thickness measurement (Auger analysis) and the bonding strength measurement were immediately conducted.

Comparative Examples 2 and 3

A strip-shaped conductive material was formed in the same manner as the solar cell lead wire 10 of Example 1, was heat-treated in a batch-type heating equipment, and further, Sn-3% Ag-0.5% Cu solder plating (liquidus-line temperature of 220° C.) was applied on the peripheral surface of the strip-shaped conductive material in the hot-dip plating equipment shown in FIG. 3 (at molten solder temperature of 340° C., workplace temperature of 30° C. and humidity in the workplace of 65 RH %), thereby forming a molten solder plated layer (a plating thickness is 20 μm at a middle portion) on upper and lower surfaces of the strip-shaped conductive material (a conductor is a heat-treated Cu). Furthermore, in An adequate amount of rosin-based flux was applied to the solar cell lead wires of these Examples 1, 2, 3, 4, 5, 6 and 7 and Comparative Examples 1, 2 and 3, each solar cell lead wire was placed on a copper plate and was heated by a hot plate (kept at 260° C. for 30 minutes), and the solar cell lead wire was soldered to a semiconductor substrate of 155 mm×155 mm×16 μm having two bus bar electrodes (without pre-solder impregnation of the electrode) as shown in FIGS. 4A and 4B. Furthermore, in order to evaluate the bonding strength of these solar cell lead wires, which are soldered to the semiconductor substrate, with respect to the semiconductor substrate, 90° peeling test (testing speed: 10 mm/min, peeled length: 15 mm) was conducted.

Evaluation results of Examples 1, 2, 3, 4, 5, 6 and 7 and Comparative Examples 1, 2 and 3 are shown in Table 2.

TABLE 2

|  | Examples | | | | | | | Comparative Examples | | |
| --- | --- | --- | --- | --- | --- | --- | --- | --- | --- | --- |
|  | 1 | 2 | 3 | 4 | 5 | 6 | 7 | 1 | 2 | 3 |
| Plating temperature | 340° C. | 340° C. | 340° C. | 340° C. | 340° C. | 340° C. | 340° C. | 340° C. | 340° C. | 340° C. |
| Workplace temperature | 30° C. | 30° C. | 30° C. | 30° C. | 30° C. | 20° C. | 30° C. | 30° C. | 30° C. | 30° C. |
| Humidity in workplace | 65 RH % | 65 RH % | 65 RH % | 65 RH % | 65 RH % | 50 RH % | 65 RH % | 70 RH % | 65 RH % | 65 RH % |
| Packing material | Not used | Not used | Al-bag | Al-bag | Al-bag | Not used | Al-bag | Not used | Not used | Al-deposited bag |
| Storage temperature | Not stored | 30° C. | 60° C. | 70° C. | 80° C. | Not stored | 85° C. | Not stored | 60° C. | 60° C. |
| Storage humidity | Not stored | 65 RH % | 95 RH % | 95 RH % | 95 RH % | Not stored | 95 RH % | Not stored | 95 RH % | 95 RH % |
| Oxidation film thickness | 3.0 nm | 3.5 nm | 3.8 nm | 5.4 nm | 6.7 nm | 0.5 nm | 7.0 nm | 7.2 nm | 10.1 nm | 8.8 nm |
| Bonding strength | ○ | ○ | ○ | ○ | ○ | ○ | ○ | X | X | X |

Comparative Example 2, the manufactured solar cell lead wire was not packed and was stored in a constant temperature and humidity bath for 3 months under the conditions of 60° C.×95 RH %, and then, the oxide film thickness measurement (Auger analysis) and the bonding strength measurement were conducted. In Comparative Example 3, the manufactured solar cell lead wire was packed in a degassed Al-deposited bag (12 μm of Al-deposited PET/15 μm of nylon/50 μm of antistatic LLDPE, oxygen permeability of 10 mL/m²·day·MPa and a water vapor permeability of 10 g/m²·day) and was stored in a constant temperature and humidity bath for 3 months under the conditions of 60° C.×95 RH %, and then, the oxide film thickness measurement (Auger analysis) and the bonding strength measurement were conducted.

From the results of the Auger analysis of the thickness of the oxidation film on the surface of the solder plating of the solar cell lead wire in these Examples 1, 2, 3, 4, 5, 6 and 7 and Comparative Examples 1, 2 and 3, it was found that the thickness of the oxidation film is thin which is 7 nm or less in all of Examples 1, 2, 3, 4 and 5 while the thickness of the oxidation film is thick which is more than 7 nm in all of Comparative Examples 1, 2 and 3. Here, the oxide film thickness is defined by time of decreasing to half of the oxidation peak value in a depth profile (sputtering time (sec) vs. composition ratio (at %)) obtained by Auger analysis, and was calculated by the formula below.

Oxide film thickness (nm)=sputtering rate converted to $SiO^2$ (nm/min)×time of decreasing to half of the oxidation peak value (min)

In Table 2, the section of "Plating temperature" indicates the temperature of the molten solder plating. The section of "Workplace temperature" indicates the temperature of the workplace where the plating operation was carried out. The section of "Humidity in workplace" indicates the relative humidity of the workplace where the plating operation was carried out. The section of "Packing material" indicates a packing bag used for storing in a constant temperature and humidity bath. The section of "Storage temperature" indicates the temperature in the constant temperature and humidity bath. The section of "Storage humidity" indicates the relative humidity in the constant temperature and humidity bath. The section of "Oxidation film thickness" indicates the thickness of the oxide film on the surface of the solder plated layer derived from a depth profile by Auger analysis (average value of n=5). The section of "Bonding strength" indicates the results of the 90° peeling test in which the copper plate and the solar cell lead wire were pulled to test the extent of pull force by which the bonding is peeled, and O (circle) indicates the pull force of 10N or more and X (cross) indicates the pull force of less than 10N.

From the results of the "bonding strength" evaluation shown in Table 2, it was found that Examples 1, 2, 3, 4, 5, 6 and 7 in which the oxide film has a thickness of 7 nm or less are excellent in bonding strength while Comparative Examples 1, 2 and 3 in which the oxide film has a thickness of more than 7 nm are poor in bonding strength.

As described above, from the evaluation results of Examples 1, 2, 3, 4, 5, 6 and 7 and Comparative Examples 1, 2 and 3, it was confirmed that the solar cell lead wire 10 in the present embodiment is excellent in bonding strength.

DESCRIPTION OF REFERENCE NUMERAL

10 solar cell lead wire
12 strip-shaped conductive material
13 molten solder plated layer

The invention claimed is:
1. A solar cell lead wire, comprising:
a molten solder plated layer on a strip-shaped conductive material formed rectangular in a cross section thereof so as to be bondable to a solar cell using a flux,
wherein a thickness of an oxide film on a surface of the molten solder plated layer, which is a sum of a thickness of an SnO layer and a thickness of an $SnO_2$ layer, is not more than 7 nm,
said thickness predetermined as permitting an effect of breaking through the oxide film during a low temperature bonding process that is near a melting point of the molten solder plated layer and predetermined as sufficiently low in temperature to avoid a cracking of a substrate of the solar cell due to a thermal stress during said bonding process.

* * * * *